United States Patent [19]

Johnson

[11] Patent Number: 5,533,032
[45] Date of Patent: Jul. 2, 1996

US005533032A

[54] BUILT-IN SELF-TEST GLOBAL CLOCK DRIVE ARCHITECTURE

[75] Inventor: Peter A. Johnson, San Jose, Calif.

[73] Assignee: Sequoia Semiconductor, Inc., Scotts Valley, Calif.

[21] Appl. No.: 783,514

[22] Filed: Oct. 28, 1991

[51] Int. Cl.⁶ .................................................. H04B 17/00
[52] U.S. Cl. ........................................ 371/22.5; 371/22.1
[58] Field of Search .................................. 371/22.5, 22.1, 371/22.3, 15.1, 27, 22.6; 324/158 R, 73.1

[56] References Cited

U.S. PATENT DOCUMENTS

| | | | |
|---|---|---|---|
| 4,513,418 | 4/1985 | Bardell, Jr. et al. | 371/25 |
| 4,669,061 | 5/1987 | Bhaysar . | |
| 4,703,484 | 10/1987 | Rolfe et al. | 371/25.1 |
| 4,894,830 | 1/1990 | Kawai | 371/22.3 |
| 5,006,787 | 4/1991 | Katircioglu et al. . | |
| 5,027,355 | 6/1991 | Stoica | 371/22.1 |
| 5,029,166 | 7/1991 | Jarwala et al. | 371/22.1 |
| 5,056,094 | 10/1991 | Whetsel | 371/25.1 |
| 5,103,167 | 4/1992 | Okano et al. | 324/158 R |

OTHER PUBLICATIONS

Stroud, "Automated BIST for Sequential Logic Synthesis" IEEE Design & Test of Computers, Dec. 1988, pp. 22–32.
"Automatic test generation for digital networks—some experimental results" Proc'72 summer computer simulation conf., Jun. 14–16, San Diego, CA. by Simulation councils, Inc.

"Automatic tester for PC boards using fault injection simulation" Pro'72 summer computer simulation Conf., Jun. 14–16, San Diego, Ca. by simulation councils, Inc.

Primary Examiner—Robert W. Beausoliel, Jr.
Assistant Examiner—Phung Chung
Attorney, Agent, or Firm—Blakely, Sokoloff, Taylor & Zafman

[57] ABSTRACT

A BIST clock driver for providing memory elements in a combinational and sequential logic circuit with a global clock signal during user mode and a test clock signal during testing. The clock driver also supplies clock signals to memory circuits that have clock inputs supplied by random logic. The clock driver supplies the random logic with a global clock signal. A clock multiplexor receives the generated clock and the test clock signal and provides the memory element with the generated clock signal during user mode and the test clock during testing of the memory element.

9 Claims, 5 Drawing Sheets

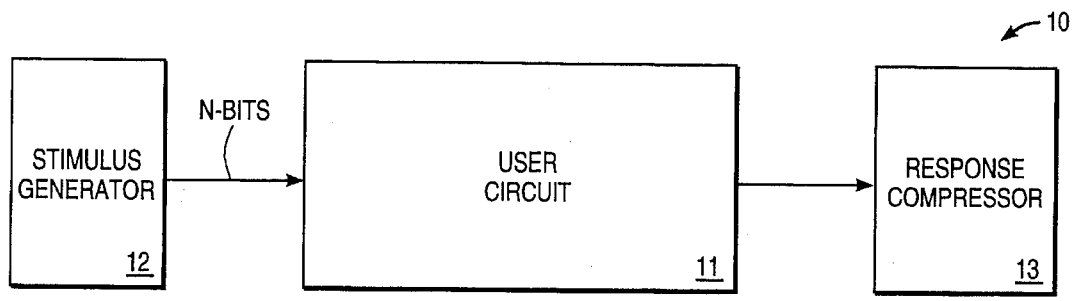
FIG_1
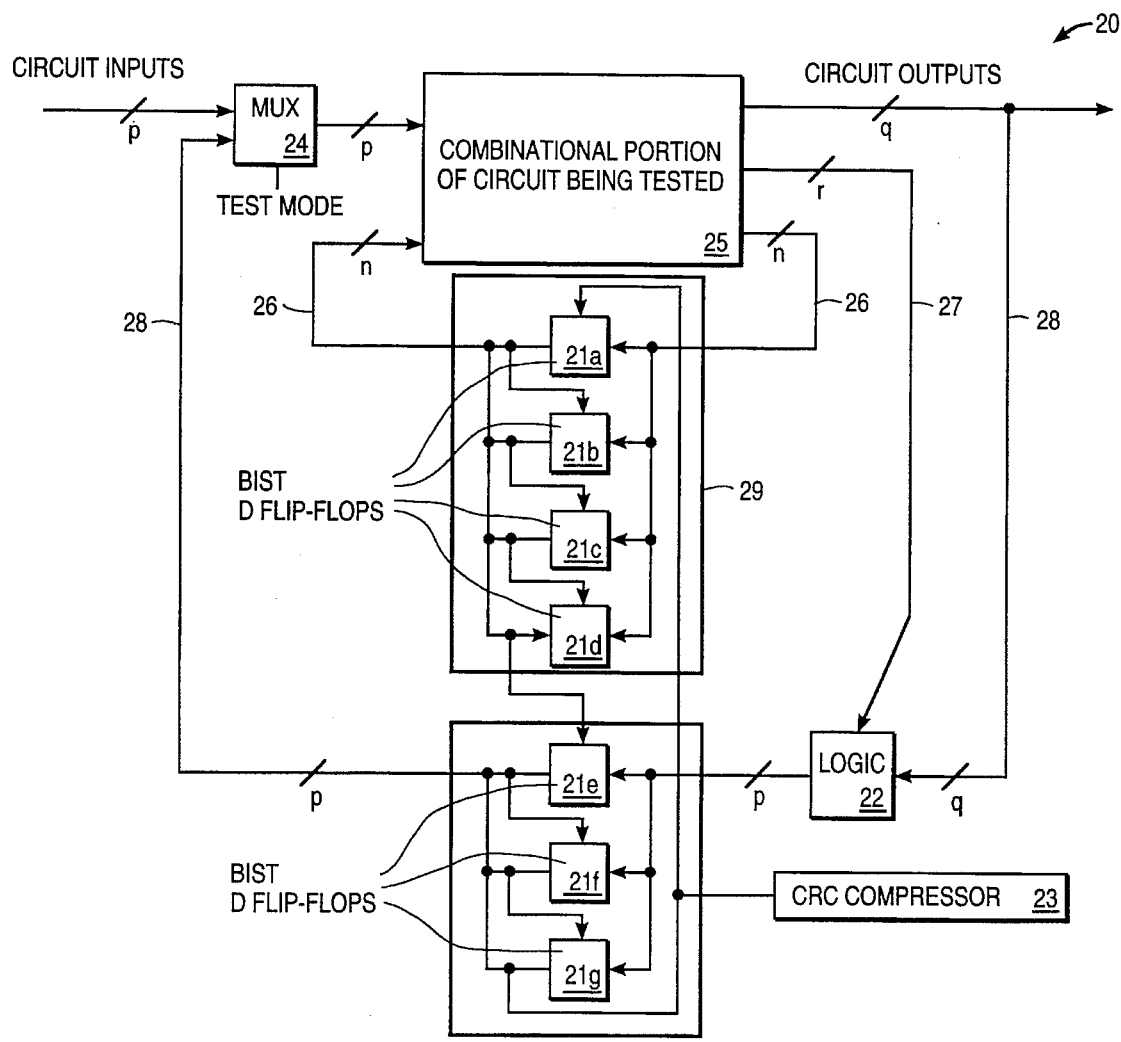
EXAMPLES OF LOGIC BLOCK 22 LOGIC:
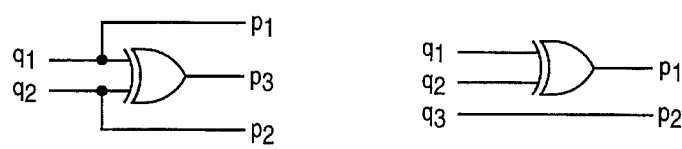
FIG_2

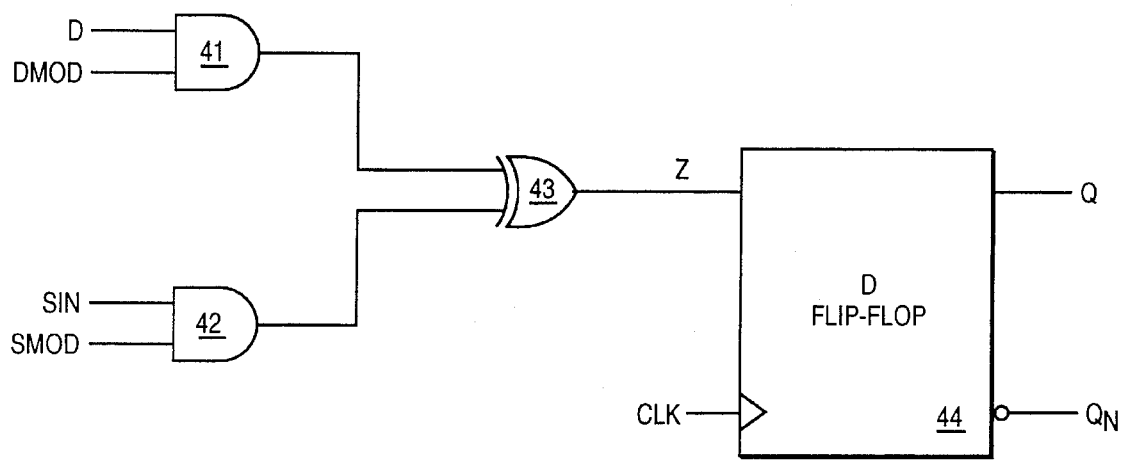
FIG_3
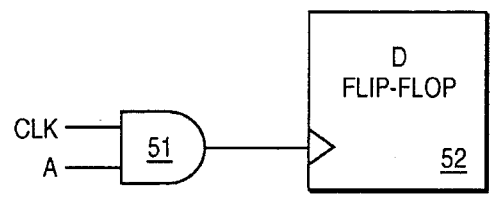
FIG_4A
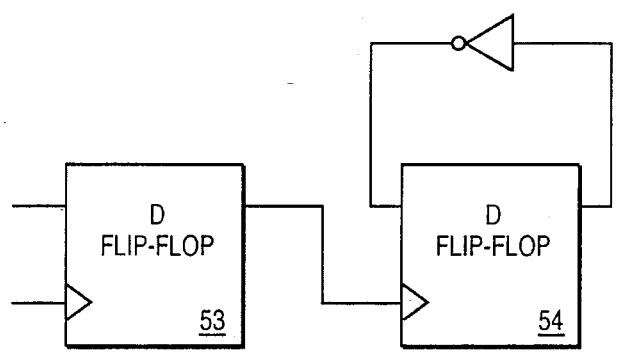
FIG_4B

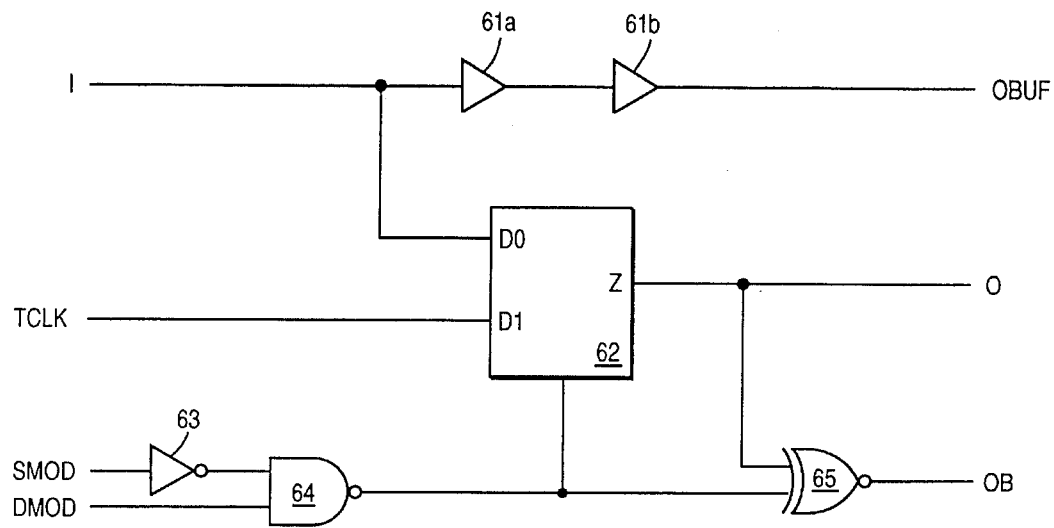
FIG_5
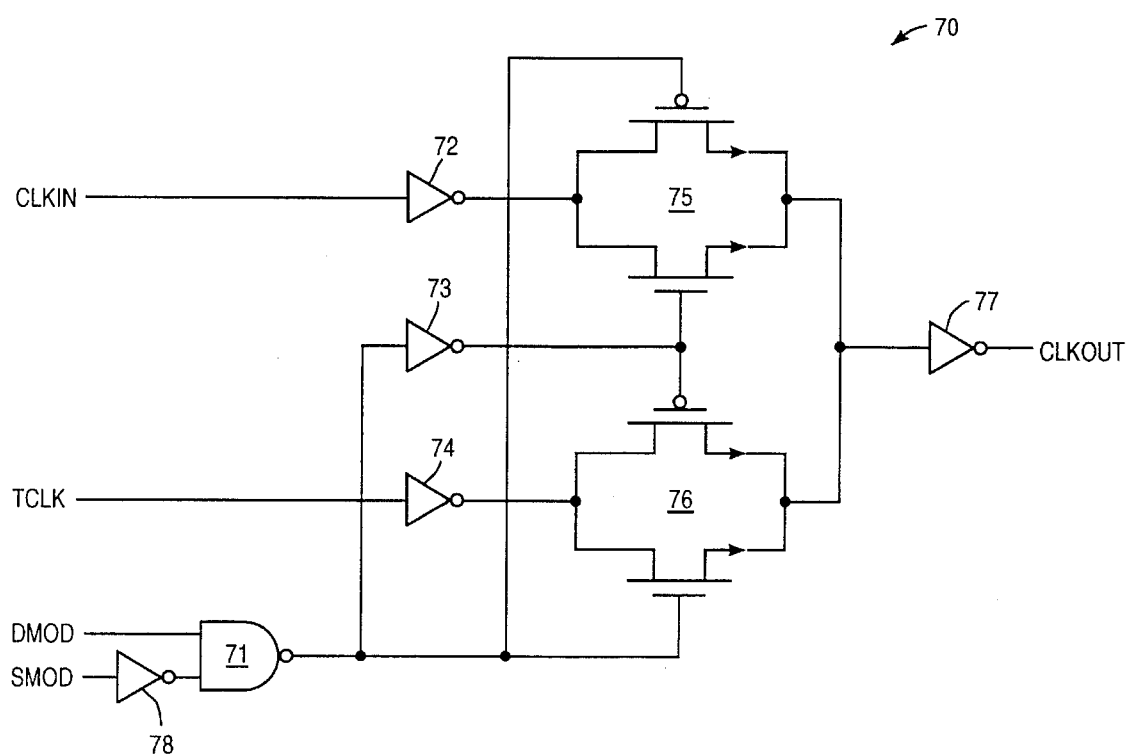
FIG_6

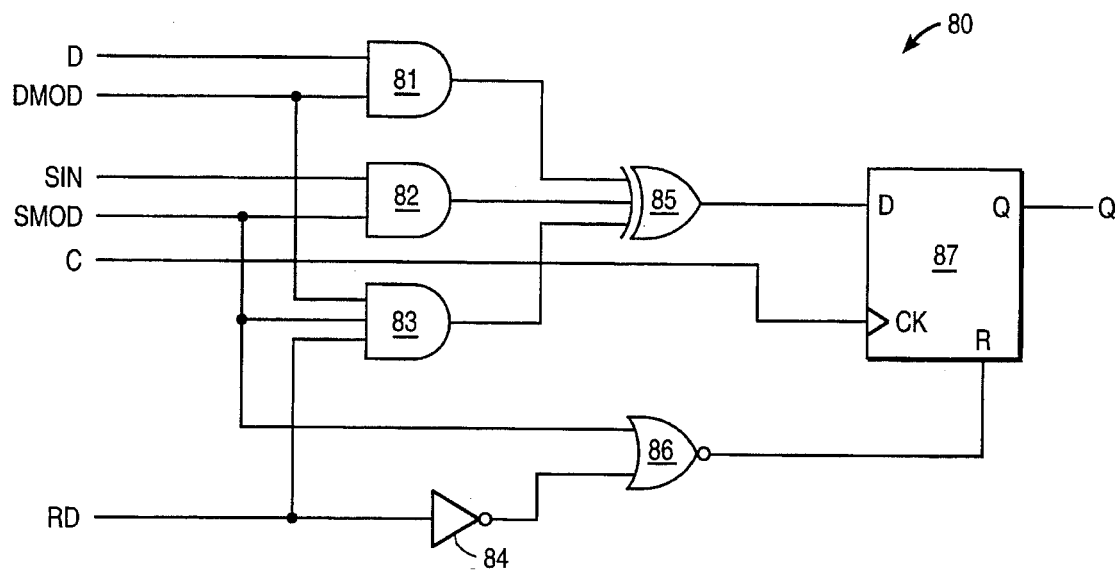
FIG_7
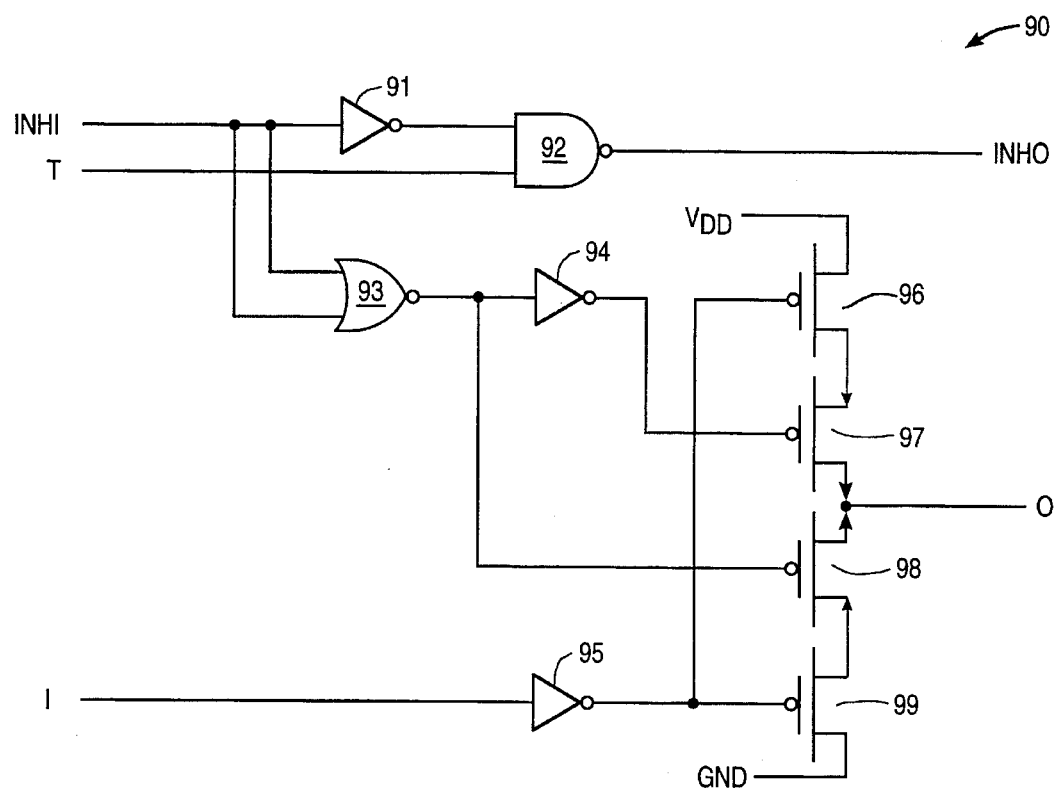
FIG_8

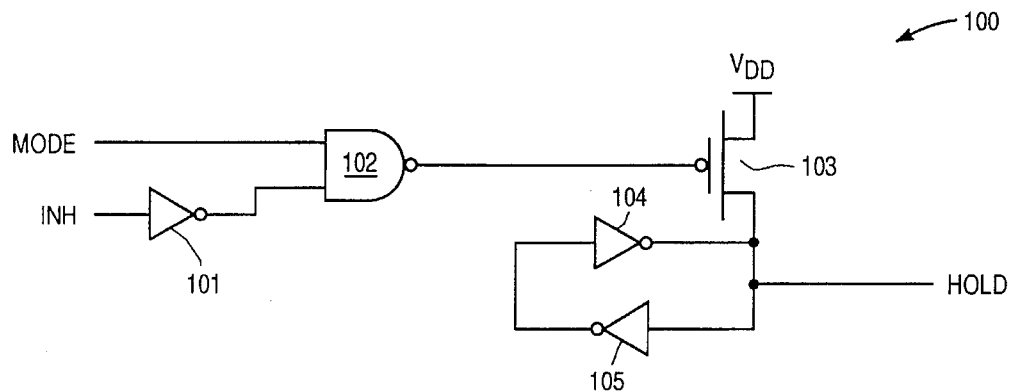
FIG_9
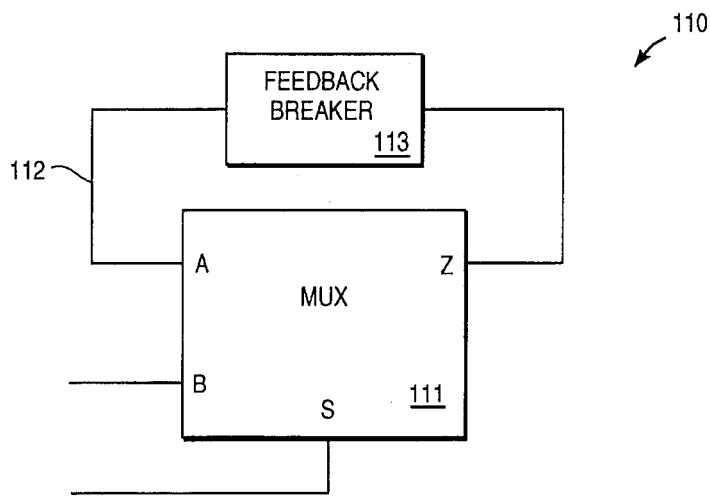
FIG_10
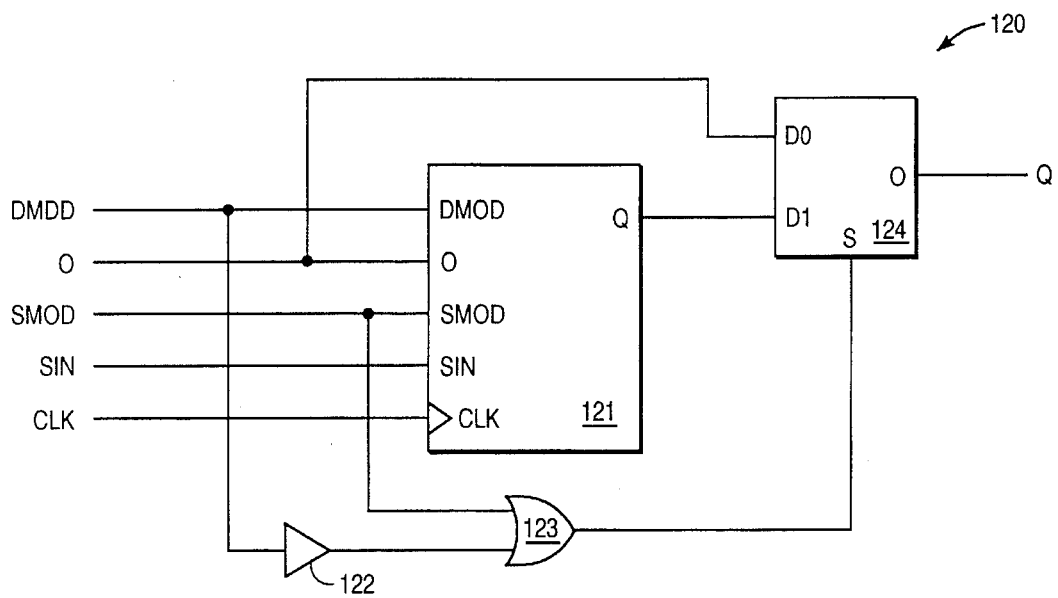
FIG_11

BUILT-IN SELF-TEST GLOBAL CLOCK DRIVE ARCHITECTURE

FIELD OF THE INVENTION

The present invention relates to the field of integrated circuit testing; particularly, to the field of built-in self-testing.

BACKGROUND OF THE INVENTION

The basic production methodology involves three main parts: design, implementation and verification (or testing). Testing takes a large quantity of the time and effort in the design, production and use of digital circuits. Testing determines whether or not the chip was manufactured without harmful defects known as faults. Faults may arise because of defective components such as logic gates, memory elements, etc. Faults may also be due to breaks or shorts in interconnections, or a number of other reasons.

To accomplish testing of ICs, a variety of testing methods and techniques have been developed in the prior art. Today, since the number of circuits that can be integrated into a chip is very large, many ICs have the testing circuitry integrated on the same chip. These testing circuits are commonly referred to as "built-in" testing circuits. When a "built-in" test operates to test the circuitry by itself, it is commonly referred to as a "built-in self-test" (BIST).

Every BIST system has two basic parts: one part provides the stimulus, or test data, for testing the custom circuit and the other collects the responses to the applied stimulus to verify whether they are correct. The stimulus can be any pattern of data that would be efficient in testing the circuit. Typically, random values are used and propagated through the logic. The custom circuit acts or "responds" to the stimulus values. The responses to the stimulus are collected. The number of responses involved is too large to compare directly with known good responses. The responses are compressed using a variety of techniques in the art. The compressed responses are accumulated to create a statistic. After testing, the statistic is compared with a reference statistic which is known to be good. If a match exists, the circuitry is deemed to be functioning properly.

BIST technology has been employed to test both combinational and sequential logic circuits. A circuit is combinational if its output is solely a function of its current input. A circuit is sequential if its output is a function of the current input and its current state. Sequential logic circuitry that holds its current state for use with future input data is commonly referred to as "memory" or "storage" circuitry.

Testing of combinational circuits is easier in comparison to sequential logic circuitry. In testing the combinational circuit, the only inputs to the logic are stimulus valves. Since combinational circuits do not have states, the responses are only dependent on the current stimulus values. Testing of sequential circuits, on the other hand, is difficult because the resulting behavior (i.e. responses) of a sequential circuit depends not only on the stimulus valves input into the circuit, but also on the current state of the logic. To obtain accurate responses, the current states of the memory elements must be controlled and observed. However, this quickly becomes impractical where the number of memory elements is anything more than minimal. Furthermore, this requires excessively long test sequences, which undesirably lengthens the time to complete production of the custom chip.

The memory elements of a sequential circuit can be isolated and controlled, thus reducing the circuit to one which is combinational. This approach is beneficial since test generation is reduced to the combinational case. One such application of the simplification was the use of a BIST flip-flop cell for replacement of a D flip-flop (Stroud, "Automated BIST for Sequential Logic Synthesis," *IEEE Design and Test of Computers,* Dec. 1988).

This technique, however, has been limited in the prior art, namely due to the fact that suitable replacement circuitry could not be found for certain memory elements. For instance, logic subject to an asynchronous reset could not be tested in this manner. The present invention proposes circuitry to allow testing of sequential logic having asynchronous resets.

Furthermore, other problems exist which are associated with replacing memory elements with equivalent circuitry. For instance, during self-testing, all memory elements must be clocked off the same signal. However, some memory elements receive these clock signals from gated logic or other flip-flop circuitry. Thus, circuitry is required to allow all the memory elements to be clocked from the same clock during self-test, while allowing the circuitry to function normally when carrying out its designated logic function.

Finally, tri-state drivers allow multiple devices to have access to the tri-state buses. Normally, two or more drivers do not "fight" over ownership of a bus. However, during self-testing, these "drive fights" can occur. Moreover, it is important that all signal values in the circuit be well-defined. In view of these considerations, there is a need for tri-state buses to be driven to a known state during testing.

Hence, the present invention provides equivalent circuits to replace existing logic circuits. The replacement circuitry of the present invention allows the circuitry to be tested when in self-testing, while being able to perform is normal function during user mode.

SUMMARY OF THE INVENTION

A clock driver for providing memory elements in a logic circuit with its clock signals is described. The clock driver includes a clock multiplexor which receives a global clock signal and a test clock signal. The clock multiplexor provides the memory elements with the test clock signal during testing of the memory elements by a built-in self-test (BIST) mechanism. The clock multiplexor provides the memory elements with the global clock signal when the memory elements are performing their designated logic function. The clock driver also provides an inverted global clock signal to those memory elements clocked on the falling edge of the clock signal.

The clock driver also includes circuitry to prevent the clock edge as seen by the memory elements from changing when the BIST mechanism changes from the supplying the global clock signal to the test clock signal or vice versa.

In the case of memory elements whose clock signals are derived from gated or random logic, the clock driver provides the global clock signal to the non-clock inputs. Moreover, the present invention includes a clock multiplexor positioned between the clock generation circuitry and the clock input of the memory circuits. The multiplexor provides the memory element with the generated clock when the memory elements are performing their designated logic function. The clock multiplexor provides the memory circuits with the test clock signal during testing of the memory element by the BIST mechanism.

BRIEF DESCRIPTION OF DRAWINGS

The present invention will be understood more fully from the detailed description given below and from the accompanying drawings of the preferred embodiments of the invention, which, however, should not be taken to limit the invention to the specific embodiments, but are for explanation and understanding only.

FIG. 1 is a block diagram of a prior art built-in self-test (BIST) architecture.

FIG. 2 illustrates the BIST architecture of the present invention.

FIG. 3 illustrates a prior art cyclic redundency code (CRC) generator.

FIG. 4 illustrates a prior art BIST flip-flop cell for replacing a D flip-flop.

FIG. 5 illustrates two common problems associated with clock signal generation for the prior art BIST replacement cells.

FIG. 6 is an electrical schematic illustrating the currently preferred embodiment of the BIST global clock driver of the present invention.

FIG. 7 is an electrical schematic illustrating the currently preferred embodiment of the BIST clock multiplexor of the present invention.

FIG. 8 is an electrical schematic illustrating the currently preferred embodiment of the BIST flip-flop with asynchronous reset of the present invention.

FIG. 9 is an electrical schematic illustrating the currently preferred embodiment of the BIST tri-state buffer of the present invention.

FIG. 10 illustrates the currently preferred embodiment of the BIST latch cell of the present invention.

FIG. 11 illustrates the currently preferred embodiment of the BIST feedback breaker of the present invention.

DETAILED DESCRIPTION OF THE INVENTION

A built-in self-test cell for providing a logic circuit with its clocking signals is described. In the following description, numerous specific details are set forth such as specific numbers of bit lines and gates, etc., in order to provide a thorough understanding of the present invention. It will be obvious, however, to one skilled in the art that the present invention may be practiced without these specific details. In other instances, well-known testing procedures have not been described in detail to avoid unnecessarily obscuring the present invention.

The present invention applies to the field of production testing of an integrated circuit (IC) and, in particular, to the testing of ICs manufactured using programmable gate arrays. These gate arrays contain both standard circuitry and programmable circuitry. In the present invention, an IC is placed in a production tester and a test program is executed to test the standard circuitry. The custom or programmed circuitry is tested using a built-in self-test (BIST) architecture.

Since some of the circuitry has sequential logic, the logic must be converted into combinational logic to allow for testing. Typically, a software program takes the user's design which does not have self-test and produces an equivalent design with self-test. The program then substitutes these circuit equivalents containing the self-test architecture for existing cells in the design in order to make the user's circuit design testable. These circuit equivalents allow for normal operation of the circuit when the circuit is to perform its designated logic function and allow for testing of the circuit during the self-test.

BIST Architecture

All BIST architectures utilize the circuit equivalents shown in FIG. 1. Referring to FIG. 1, BIST architecture 10 displays the IC under test, user circuit 11, as part of the BIST architecture. Stimulus generator 12 is coupled to circuit 11 to generate test patterns. Circuit 11 receives the test pattern data as inputs N bits and creates test responses to the data. The response compressor 13 collects the test responses from circuit 11 and compresses them to create a statistic. This statistic is commonly referred to as a signature. The signature is compared with a reference signature that is known to be good. If the comparison produces a match, the circuit is deemed to be functioning properly. A mismatch between the test signature and the reference signature indicates that a fault exists in user circuit 11. Control for BIST architecture 10 comes from a BIST controller (not shown). In the currently preferred embodiment, BIST controller generates two signals, DMOD and SMOD, to control the operation of user circuit 11. These signals are discussed later.

An example of a BIST architecture employed by the currently preferred embodiment is shown in FIG. 2. BIST architecture 20 receives p circuit input signals. The p input signals are coupled to one input of multiplexors (MUX) 24, a group of multiplexors accommodating the p circuit inputs. The output of MUX 24 consists of p output signals coupled to combinational circuit 25. Combinational circuit 25 is the combinational portion of the circuit being tested, circuit 11 (FIG. 1). Combinational circuit 25 generates q output signals. Combinational circuit 25 also generates r output signals which represent the clocks generated by random logic (as taken from the CLKIN input to clock MUX 70, as discussed later in conjunction with FIG. 6). The r and q output signals are coupled to logic block 22 via lines 27 and 28 respectively. The output of logic block 22 consists of p output signals. The p output signals of logic block 22 are coupled to BIST D flip-flops 21e–g. Only three D flip-flops are shown, however the actual number is dependent on the number of circuit output signals q and current states n. Flip-flops 21e–g combine circuit outputs in current state to provide new test values to circuit inputs. The output of each of flip-flops 21e–g are coupled to one of the inputs of the following flip-flop, such that a chain is formed with the output of flip-flop 21g being fed to BIST cell 21a. A total of p output signals from flip-flops 21e–g are also fed back and coupled to the other input of MUX 24.

Combinational circuit 25 also generates n output signals corresponding to the states of the memory elements within BIST architecture 20. These n output signals are coupled to BIST cells 21a–d using lines 26. BIST cells 21a–d are storage elements in the logic circuit which have been changed to BIST versions (as will be discussed more thoroughly below). The number of storage elements in the circuit can vary and every n output signal corresponds to a storage element in the circuit. The outputs of BIST cells 21a–d are coupled to the next BIST cell with the output of the BIST cell 21d being coupled to an input of BIST D flip-flop 21e. The outputs of BIST cells 21a–d are also coupled as new state values to combinational circuit 25 via line 26. Finally, feedback 29 couples the output of BIST D flip-flop 21g to one of the inputs to BIST cell 21a. Coupled to feedback 29 is signature unit 23.

Functionally, p circuit input signals are fed to MUX 24. MUX 24 receives a test mode signal. If the test mode signal indicates that the circuit 11 (FIG. 1) is in user mode, then MUX 24 outputs the p circuit input signals to combinational circuit 25. In response to these inputs, combinational circuit 25 generates q circuit output signals. If the test mode signal indicates that the circuit 11 (FIG. 1) is in test mode, the p output signals on line 28 from D flip-flops 21e–g are input, via MUX 24, to combinational circuit 25. These p output signals represent new test values for combinational circuit 25.

In response to the new test values from MUX 24, representing the outputs of the BIST D flip-flops 21e–g, combinational circuit 25 generates q output signals representing the outputs of the logic, r output signals representing the clocks generated by random logic, and n output signals representing the states from memory elements in the circuit being tested. Not all circuits being tested generate r output signals. If the r output signals are generated, logic block 22 performs an exclusive-ORing of the r output signals from lines 27 with the q output signals on line 28, thereby increasing or reducing the number of p output signals of logic block 22. The number of circuit q output signals is equal to the number of circuit p input signals. Due to this, logic block 22 combines extra r output signals, if any, with the q output signals to obtain the number of inputs.

The p output signals from logic block 22 and the n output signals from combinational circuit 25 are input to BIST D flip-flops 21a–d and BIST cells 21a–d respectively. As stated earlier, BIST cells 21a–d are storage elements in the circuit which have been changed to BIST equivalence (discussed below).

In the arrangement as shown, the BIST cells, 21a–g, are coupled to each other forming a chain. The output of the last BIST cell in the chain, cell 21g, is feedback to the input of the first BIST cell, 21a. This arrangement creates a ring. The ring structure functions as stimulus generator 12 (FIG. 1). Since the output of each BIST cell is coupled to the input of another BIST cell, the outputs of each BIST cell in the chain shift to the next BIST cell at each cycle. These shifting outputs constitute the test pattern data for the next clock cycle. In this manner, BIST architecture 20 acts as stimulus generator.

Signature unit 23 is typically a cyclic redundancy code (CRC) generator. Signature unit 23 can be coupled to the stimulus generator at any place along the ring. Signature unit 23 accumulates a bit stream from the ring. The bit stream is compacted by signature unit 23 to create a statistic. The statistic is then checked for accuracy against a statistic that is known to be good. In this manner, BIST architecture 20 tests user circuit 11.

It should be noted that the BIST architecture is not limited to its embodiment in FIG. 2. Each BIST cell in the BIST architecture corresponds to one memory element in user circuit 11. Therefore, the number of BIST cells in any particular BIST architecture depends on the number of memory elements in the circuit being tested and the number of inputs to the circuit. Exclusive-OR gates can be added to reduce q output signals on lines 28 when the output signals outnumber the p input signals. Exclusive-OR gates can also be added to generate additional p input signals (feedback to MUX 24) if q output signals outnumber the p input signals. Examples of each are shown at the bottom of FIG. 2, using exclusive-OR gates. The purpose behind using an exclusive-OR gate is because one input does not have sole control of the output. This exclusive-ORing is accomplished by logic block 22.

When the BIST sequence is activated, the BIST cells are reset and connected to form the circular chain with the output of one BIST cell going to the one of the inputs of the next BIST cell. The BIST controller first initializes the BIST cells in one clock cycle. Then it initializes the general sequential logic in the circuitry under test.

Once the structure has been connected, a test pattern is then generated. The controller now puts the circuit into BIST mode and applies the initialized value in the BIST chain to the general sequential logic being tested. It computes the resulting logic values at the system inputs of the BIST cells with the initialized value in the chain and shifts by one each memory element in the BIST chain via the exclusive-or function. The original starting stimulus is the setting of all of the flip-flops in the chain to zero. This will produce an automatic change due to some path between two flip-flops having an inverter. The inverter causes the value to change from a logical 0 to a logical 1 and this value will be clocked in. If no path has an inverter, such that no inversion path exists, then some of flip-flops can be preset to a logical 1. Signature unit 23 is attached to the chain to compress the bit stream corresponding to the final signature.

Memory Element Circuit Equivalents

FIG. 3 shows the basic architecture for the BIST flip-flop cell 40 which is substituted for the D flip-flop in circuit 11. BIST cell 40 uses exclusive-Or gate 43, with each input driven by AND gates 41 and 42. Exclusive-Or gate 43 provides input Z to the input of the D flip-flop 44. The inputs to AND gate 41 are the input D and the DMOD signal. Input D is the input that D flip-flop 44 would receive when its performing its designated logic function. The DMOD signal is a mode signal from the BIST controller. The inputs to AND gate 42 are the SIN signal and the SMOD signal. The SIN signal is the output signal from the device which preceeds D flip-flop 44 on the scan chain. The SMOD signal is a mode signal from the BIST controller.

The BIST controller mode signals, DMOD and SMOD, provide four modes of operation: reset mode, user mode, shift mode, and BIST mode. In the reset mode (DMOD=0, SMOD=0), BIST cell 40 sets the output of D flip-flop 44 to a logical zero, thereby initializing the BIST chain and the general sequential logic being tested. In the user mode (DMOD=1, SMOD=0), D flip-flop 44 operates an a normal D flip-flop and performs it's designated function. In the shift mode (DMOD=0, SMOD=1), the BIST chain is configured into a partial scan chain that could be used to achieve additional fault coverage beyond what the BIST mode provides. Finally, the BIST mode (DMOD=1, SMOD=1), performs an exclusive-or of the system data input and the output data from the previous flip-flop in the BIST chain.

The problem with all memory cells, including the cell shown in FIG. 3, is that they restrict the clock to one which is well-behaved. In other words, all of the clock inputs must be clocked by the same clock signal. However, some clocking signals are gated clock signals or are derived out of gated logic, as shown in FIG. 4A. In FIG. 4A, the clock signal of D flip-flop 52 is the output of AND gate 51, which has inputs of the system clock, CLK, and input signal A. This configuration essentially creates new clocking signals.

Another problem is that some D flip-flops employ a ripple carry counter, as shown in FIG. 4B. Referring to FIG. 4B, the Q output of D flip-flop 53 is the clock input to D flip-flop 54. In this arrangement, flip-flop 54 is toggled when the output of D flip-flop 53 changes from 0 to 1. This essentially creates a new clock signal.

The problem with both of the situation displayed in FIG. 4A and FIG. 4B is that the clocking signals are derived from different clock sources. However, all memory elements must be clocked off the same clock during self-test mode because the responses derived from supplying the random test sequence to the logic circuit during testing could produce incorrect results. Global clock driver 60, as shown in FIG. 5, provides the memory cell with normal clocking signals during user mode and allows all clocking signals to be clocked off the same test clock during self-test.

BIST Clock Driver of the Present Invention

Referring to FIG. 5, the currently preferred embodiment of the BIST global clock driver 60 is shown. BIST driver 60 consists of invertors 61*a* and *b*, and 63, Multiplexor (MUX) 62, NAND gate 64, and exclusive-NOR gate 65. The input of inverter 61*a* is coupled to input I. The output of inverter 61*a* is coupled to inverter 61*b*. The output of inverter 61*b* is coupled to the output signal OBUF. MUX 62 receives inputs I, TCLK and S and produces output Z. Input I is coupled to the D0 input of MUX 62. Input TCLK is coupled to the D1 input. The output of NAND gate 64 is coupled to the S input of MUX 62. The DMOD signal and the output of inverter 63 are coupled to the inputs of NAND gate 64. The input of inverter 63 is coupled to SMOD. The output of NAND gate 64 is coupled to input S of MUX 62 and one of the inputs of exclusive-NOR gate 65. The other input to exclusive-NOR gate 65 is coupled to the output of MUX 62, and it produces output signal OB.

Clock driver 60 has four input signals: I, TCLK, SMOD and DMOD. Input signal I is the normal clock signal. The I input can come from any clocking source (e.g., through a pin from off-chip). The TCLK signal represents the test clock signal which drives the operation of the memory element during BIST mode. The test clock, which is normally slower than the regular clock, can be derived from any source. SMOD and DMOD are signals generated by the BIST controller. The SMOD signal is the shift mode signal, and the DMOD signal is the data mode signal. As stated above, the BIST controller controls the operation of logic circuit 11 (FIG. 1) using the SMOD and DMOD signals.

BIST global clock driver 60 produces three output signals in response to the input signals. These output signals are OBUF, O and OB. The OBUF signal is the clocking signal that drives the non-clock inputs. In other words, the OBUF signal drives the gated logic which clocks some memory elements. The OBUF signal is derived from the global clock signal, I in all four modes. Signal I is buffered through invertors 61*a* and *b*. The output of invertors 61*a* and *b* is the OBUF signal.

The O signal is the global clock signal from clock driver 60 and clocks all of the circuit logic which is clocked on the rising edge of the clock signal. The O signal is the normal clock signal during user mode and the test clock during BIST mode. Signal O is the output Z from MUX 62. MUX 62 receives the global clock signal I and the test clock signal TCLK as clock inputs. MUX 62 also receives a selection signal S which selects either the global clock I or test clock TCLK as the output Z (i.e., the clock) of MUX 62 to the user circuit. Selection signal S is the output of NAND gate 64. NAND gate 64 has the DMOD signal and the output of inverter 63 as its input. The input to inverter 63 is the SMOD signal.

The OB signal is the inverted clock signal from clock driver 60. The OB clocking signal is used to clock all circuit logic which clocks on the falling edge of the clock signal.

The OB signal is the normal clock signal inverted during user mode and the test clock during BIST mode. The OB signal is the output of exclusive-NOR gate 65. Exclusive-NOR gate 65 has the output of MUX 62 and the output of NAND gate 64, the selection signal, as inputs.

During user mode (DMOD=1, SMOD=0), the SMOD signal is inverted by inverter 63. Thus, the inputs to NAND gate 64 are both logical 1s. NAND gate 64 produces a logical 0 output in response to the DMOD and SMOD inputs. Therefore, a logical 0 is the selection signal, S, for MUX 62. MUX 62 outputs the global clock signal I in response to the selection signal S being a logical 0.

The OB signal during user mode is the inverted global clock signal I since exclusive-NOR gate 65 receives a logical 0 from NAND gate 64. When exclusive-NOR gate 65 receives a logical 0 from NAND gate 64, its output is the inverted clock signal from MUX 62. Thus, the OB signal is the inverted O signal during user mode.

In the three remaining modes (initialization mode, shift mode, and BIST mode), the output clock signal O to the user circuit will always be the test clock signal TCLK. This is true because in response to any of the three sets of DMOD and SMOD signals for the three modes, NAND gate 64 outputs a logical 1. The logical 1 output is the select signal S for MUX 62 and causes it to output test clock signal TCLK as signal O to the user circuit.

Furthermore, since the select signal S is a logical 1 and the clock signal for the user circuit is TCLK for the shift, reset and the BIST modes, the OB signal during these modes is the same as the O signal. This is important since during BIST mode, all of the memory elements need to be clocked off the same signal. If some of the signals were allowed to be clocked off the falling edge of the clock instead of the rising edge (or vice versa), all of the memory elements would not produce outputs at the same time in response to the test stimulus. Therefore, testing of the memory elements would render inaccurate results.

To accommodate memory elements having gated clocks or clocks which are generated from random logic having the global clock signal I as one of its inputs (FIG. 4A), the present invention uses a buffered global clock signal OBUF and a BIST clock multiplexor to allow the user circuit to receive its generated clock during user mode and the test clock signal during self-test, or BIST mode. Thus, the OBUF signal goes to all non-clock inputs. This is also important for ensuring that OBUF is a random value during BIST mode.

When changing to or from user mode, new clock edges can be created. This occurs when the I and TCLK clock signals have different values. During mode changing, the values on the DMOD and SMOD signals are changed causing a new value to be placed on select signal S. At this time, if the selected clock signal, either I or TCLK, has a clock edge and the other signal does not, a clock edge would be created. To prevent this from causing problems, any mode change is preceded by a change into reset mode. This is acceptable because during reset mode the occurrence of an extra clock edge does not matter. During switches in which the user mode is not a part, the select signal S never changes, so a clock edge only happens when TCLK rises.

BIST Clock Multiplexor

The currently preferred embodiment of the BIST clock multiplexor is shown in FIG. 6. BIST clock mux 70 consists of invertors 72, 73, 74, 77 and 78, NAND gate 71 and two transmission gates (i.e. a transistor pair of complimentary MOSFET switches in parallel) 75 and 76. The input of inverter 72 is coupled to the CLKIN signal. The output of inverter 72 is coupled to transmission gate 75. The gates of transmission gate 75 are coupled to the output of NAND gate 71 and the output of inverter 73 respectively. The output of transmission gate 75 is coupled to the input to inverter 77. The output to inverter 77 is the CLKOUT signal. The input of inverter 74 is coupled to the TCLK signal. The output of inverter 74 is coupled to transmission gate 76. The gates of transmission gate 76 are coupled to the output of NAND gate 71 and the output of inverter 73 respectively. The output of transmission gate 76 is coupled to the input to inverter 77. The output to inverter 77 is the CLKOUT signal. The inputs of NAND gate 71 are coupled to the DMOD signal and an inverted SMOD signal.

MUX 70 is inserted between the clock generation circuitry for a memory element and the memory element clock inputs which it drives. MUX 70 receives the clock signal produced by the random logic as its CLKIN signal. MUX 70 also receives test clock signal TCLK and the BIST controller mode signals DMOD and SMOD. Each of the clock signals, CLKIN and TCLK, are inverted by invertors 72 and 74 respectively, and the outputs of the invertors 72 and 74 are coupled to transmission gates 75 and 76 respectively. The output of both transmission gates is inverted by inverter 77. The output of inverter 77 is the clock signal for the memory element. The DMOD and SMOD signals control the operation of transmission gates 75 and 76 using NAND gate 71 and inverter 73. Using the DMOD and SMOD signals, the BIST controller allows MUX 70 to pass the generated clock signal CLKIN to the memory element during user mode and test clock signal TCLK to the memory element during the three other modes.

In user mode (DMOD=1, SMOD=0), the output of NAND gate 71 is a logical 0. This logical 0 output prevents transmission gate 76 from passing the inverted test clock signal TCLK to inverter 77. However, the logical 0 output of NAND gate 71 causes transmission gate 75 to switch-on and pass the inverted CLKIN signal to inverter 77. Thus, during user mode, the generated clock signal CLKIN is output by MUX 70 to clock the memory element.

In the three remaining modes, the output of NAND gate 71 is a logical 1. The logical 1 output prevents transmission gate 75 from passing the inverted generated clock to inverter 77. On the other hand, it switches on transmission gate 76 causing the inverted test clock signal TCLK to pass to inverter 77. Thus, during the remaining three modes, the test clock signal TCLK is output by MUX 70 to clock the memory element.

Therefore, MUX 70 is used in conjunction with the buffered output OBUF of clock driver 60 or a clock generated by the output of a storage element to allow a sequential logic circuit that has its clock generated from random logic to be tested during test mode and perform its designated function during user mode.

BIST Cell Having an Asynchronous Input

Some memory elements are subject to asynchronous inputs. The test program replaces the memory elements having an asynchronous input in the user circuit with a BIST cell equivalent. The BIST cell performs the normal function of the memory element having an asynchronous input, such as being reset asynchronously, during user mode. However, during self-test, the BIST cell is prevented from being reset. This feature is important because the outputs of the logic must be known during self-test. If a device could be reset asynchronously during testing, the response data produced by the test generation would be inaccurate and could indicate that a fault exists when none in fact does.

The BIST cell with an asynchronous input is shown in FIG. 7. Referring to FIG. 7, BIST cell 80 comprises AND gates 81, 82 and 83, inverter 84, exclusive-OR gate 85, NOR gate 86, and D flip-flop 87. The inputs of AND gate 81 are coupled to the data signal D and the DMOD signal. The output of AND gate 81 is coupled to one of the inputs to exclusive-OR gate 85. The inputs of AND gate 82 are coupled to the shift chain signal SIN and the SMOD signal. The output of AND gate 82 is coupled to exclusive-OR gate 85. In the currently preferred embodiment gates 81–83 are NAND gates and gate 85 is an exclusive-NOR gate. Shift chain signal SIN comes from the previous memory element in the scan chain structure. The inputs to AND gate 83 are coupled to the DMOD, SMOD and reset signal RD. The output of AND gate 83 is coupled to exclusive-OR gate 85.

The output of exclusive-OR gate 85 is coupled to the D input of D flip-flop 87. A clock signal C is coupled to the CK input of D flip-flop 87. The output of NOR gate 86 is coupled to the R input of D flip-flop 87. The inputs of NOR gate 86 are coupled to the SMOD signal and the output of inverter 84. The input of inverter 84 is coupled to the reset signal RD.

D flip-flop 87 is shown as being subject to an asynchronous reset signal at its port R. It should be noted that the present invention applies to all memory elements having asynchronous inputs, such as D flip-flop 87. Therefore, the principles behind the gated logic feeding the D (data) and the R (reset) inputs can be applied to any memory element having an asynchronous input.

In reset mode (DMOD=0, SMOD=0), AND gates 81, 82, and 83 all output a logical 0. With all of its inputs 0, exclusive-or gate 85 outputs a logical 0. Therefore, during reset mode, any rising edge of the clock signal causes a logical 0 to be clocked into D flip-flop 87. This occurs regardless of the values on the SIN, D, and RD.

In addition, while in the reset mode, if the RD signal from the reset pin goes to a logical 1 (high), D flip-flop 87 also resets. It should be noted that when changing modes, the reset mode should not be passed through unless a reset of D flip-flop 87 is intended. For example, suppose D flip-flop 87 is in user mode (SMOD=0, DMOD=1). To put D flip-flop 87 in scan mode (SMOD=1, DMOD=0), the SMOD signal must be raised to a logical 1. This moves D flip-flop 87 into BIST mode. The DMOD signal is then lowered to a logical 0 to move D flip-flop 87 into scan mode. (This must be done to ensure that the clock driver does not glitch.) BIST cell 80 can also be modified to prevent the RD signal from affecting the output of D flip-flop 87 during the reset mode. To accomplish this, exclusive-OR gate 85 would also receive the DMOD signal inverted. This would force the R input of D flip-flop to zero whenever BIST cell 80 is in reset mode.

In user mode (DMOD=1, SMOD=0), the output of AND gate 81 is whatever value the data is on the D input. The output of the other two AND gates is a logical 0. Therefore, the D input of D flip-flop 87, which is the output of OR gate 85, is the data value on the D input. Also during user mode, since the SMOD signal is low, if reset pin RD goes to a logical 1, both inputs to NOR gate 86 will be a logical 0 causing its output to be a logical 1. The logical 1 output resets D flip-flop 87. Thus, BIST cell 80 functions as a D type flip-flop subject to an active high reset signal, RD. Furthermore, all data presented on the SIN pin is ignored during user mode.

In scan mode (DMOD=0, SMOD=1), the output of AND gate 82 is whatever value is on the SIN pin. The other two AND gates, 81 and 83, output a logical 0. Therefore, the D input of D flip-flop 87, which is the output of exclusive-OR gate 85, is the value on the SIN input pin. During scan mode, since the SMOD signal is high, the input to NOR gate 86 is a logical 1 causing its output to be a logical 0. Therefore, D flip-flop 87 does not receive its reset signal. Thus, during scan mode, both the D and RD pins are ignored, and BIST cell 80 functions as a D type flip-flop with its D input coming from the SIN pin.

In self-test mode (DMOD=1, SMOD=1), AND gates 81, 82 and 83 produce as outputs the value on the D input pin, the SIN pin and the reset pin RD respectively. The outputs of these gates is then exclusive-Ored by gate 85 to produce the input D to D flip-flop 87. Thus, in self-test mode, the value at the D input of D flip-flop 87 on the rising edge of the clock signal CK is the sum of the values on the SIN pin, data input D and reset pin RD modulo-2 (exclusive-or). In this mode, reset signal RD going active (i.e., logical 1) will not reset D flip-flop 87, but it will contribute to the value stored on the rising edge of the CK signal, and thus be tested.

Tri-state Buses

Many combinational and sequential logic circuits utilize tri-state buses. These buses are driven by tri-state drivers. In self-test mode, it is important that all signal values in the user circuit be well defined on the rising edge of the test clock. Thus, the value on the tri-state bus must be ascertainable during self-test. The present invention satisfies this criterion by driving the bus to a predetermined value during self-test if none of the drivers are driving the bus. Furthermore, during self-test, since the testing method is pseudo-random testing, there are no illegal states. Therefore, it is possible that two or more drivers may attempt to drive data onto the tri-state bus at the same time.

The present invention is a BIST tri-state driver cell which replaces the tri-state drivers in the user circuit and performs their normal function, such as driving data onto the tri-state bus, during user mode. However, during self-test, the tri-state bus is driven to a known state. This feature is important because the outputs of the logic must to be known during self-test. If the bus were permitted to float, or hold, during testing, the response data produced by the test generation could be inaccurate and could indicate that a fault exists when none in fact does.

The currently preferred embodiment of the BIST tri-state driver is BIST driver 90, as shown in FIG. 8. BIST driver 90 consists of invertors 91, 94 and 95, NAND gate 92, NOR gate 93, two p-channel transistors 96 and 97, and two n-channel transistors 98 and 99. The input to inverter 91 is coupled to the INHI signal. The output of inverter 91 is coupled to one of the inputs to NAND gate 92. The other input of NAND gate 92 is coupled to signal T. NAND gate 92 produces the INHO signal as its output. The inputs of NOR gate 93 are coupled the INHI and T signals. The output of NOR gate 93 is coupled to the input of inverter 94 and the gate of n-channel transistor 98. The output of inverter 94 is coupled to the gate of p-channel transistor 97. The input of inverter 95 is coupled to signal I. The output of inverter 95 is coupled to the gate of n-channel transistor 99 and the gate of p-channel transistor 96. The source of transistor 96 is coupled to voltage suppy of the chip, Vdd. The drain of transistor 96 is coupled to the source of transistor 97. The drain of transistor 97 and the drain of transistor 98 are coupled to output O. The source of transistor 98 is coupled to the drain of transistor 99. The source of transistor 99 is coupled to ground, GND.

Referring to FIG. 8, each BIST driver 90 receives as inputs an inhibit-in signal, INHI, a tri-state enable signal, T, and an input data signal, I. It should be noted that BIST driver 90 does not have any of the mode signals (e.g., DMOD or SMOD) as inputs. Thus, the BIST drivers of the present invention act independent of the BIST controller. BIST driver 90 produces an inhibit-out signal, INHO, and a data signal O which is driven by BIST driver 90 onto the tri-state bus.

One feature of the present invention is the ripple inhibit signal, which is defined by the inhibit-in and inhibit-out signals. The inhibit-out signal is the output of NAND gate 92. The inputs to NAND gate 92 are the tri-state driver enable signal T and the inhibit-in signal INHI inverted by inverter 91. When the INHI (inhibit-in) pin is at logical 0 (low), BIST driver 90 may drive the bus if its enable signal, T, is also at logical 0. If the INHI pin is high, then BIST driver 90 cannot drive the bus regardless of the value of enable signal T. A truth table describing the operation of ripple inhibit signal is shown below:

| INHI | T (Enable) | D | INHO | O |
|---|---|---|---|---|
| 0 | [001f]0 | 0 | 1 | 0 |
| 0 | 0 | 1 | 1 | 1 |
| 0 | 1 | 0 | 0 | z |
| 0 | 1 | 1 | 0 | z |
| 1 | 0 | 0 | 1 | z |
| 1 | 0 | 1 | 1 | z |
| 1 | 1 | 0 | 1 | z |
| 1 | 1 | 1 | 1 | z |

By linking all of the BIST drivers 90 into a chain, with one INHO signal coupled to the inhibit-in signal INHI of the next BIST driver cell 90, drive fights will be prevented during testing. The inhibit-in INHI signal for the first driver in the chain is always held to logical 0.

The remainder of BIST driver 90 is the buffer for driving data from data input I onto the tri-state bus. In the currently preferred embodiment, four transistors, 96, 97, 98, and 99 are coupled serially between the voltage source for the chip, Vdd, and ground, GND. The gates of transistors 96 and 97 are responsive (turn on) to a logical 0, while the gates of transistors 98 and 99 are responsive (turn on) to a logical 1. The gates of transistors 96 and 99 are coupled to data input signal I inverted by inverter 95. The gates of transistors 98 and 97 are coupled to the output of NOR gate 93 and its output inverted, as inverted by inverter 94, respectively. The inputs to NOR gate 93 are inhibit-in signal INHI and tri-state enable signal T.

Functionally, when both inhibit-in signal INHI and tri-state enable signal T are both logical 0, NOR gate 93 outputs a logical 1. The logical 1 output is input to inverter 94. In response to the logical 1 input, inverter 94 outputs a logical 0 causing transistor 97 to conduct. The logical 1 output of NOR gate 93 places transistor 98 in conduction as well. Input data signal I places transistors 96 or 99 in conduction, via inverter 95, depending on whether input 1 is a logical 1 or logical 0 respectively. If the data is a logical 1, inverter 95 outputs a logical 0, causing transistor 96 to conduct. In response, the voltage Vdd pulls up the output signal O to a logical 1 and, thus, a logical 1 is driven onto the tri-state bus when the driver is enabled. If the data is a logical 0, inverter 95 outputs a logical 1. This causes transistor 99 to couple tri-state output signal O to ground. Thus, BIST driver 90 drives a logical 0 onto the tri-state bus, when enabled.

BIST Tri-state Bus Hold/Pullup Circuitry of the Present Invention

When none of the BIST drivers are driving the tri-state bus, the bus is either pulled up to a logical 1 (high) or the bus, using a bus hold circuit, retains the state to which it was last driven. This is a design choice. Typically, pullup capability is provided by a pullup resistor tied to Vdd. However, this requires static current consumption. For example, if the tri-state bus is driven low, then a resistive path is created between power and ground. This consumes current. Furthermore, if the tri-state bus uses a bus hold, the bus hold circuitry holds a state. In self-test mode, all states must be controllable. Therefore, the bus hold circuitry must be disabled during self-test.

The pullup circuitry and the bus hold circuitry of the currently preferred embodiment of present invention is provided by BIST cell 100, as shown in FIG. 9. BIST cell 100 comprises invertors 101, 104, and 105, NAND gate 102 and p-channel transistor 103. The input of inverter 101 is coupled to signal INH. The output of inverter 101 is coupled to one of the inputs to NAND gate 102. The other input of NAND gate 102 is coupled to the MODE signal. The output of NAND gate 102 is coupled to the gate of transistor 103. The source of transistor 103 is coupled to the supply voltage, Vdd. The drain of transistor 103 is coupled to the HOLD output and the input to inverter 105. The output of inverter 105 is coupled to the input of inverter 104. The output of inverter 104 is coupled to the source of transistor 103. Not that inverter 104 is a weak device.

BIST cell 100 can be used as both a bus pullup or a bus hold circuit depending on the design choice. BIST cell 100 has two inputs: a MODE signal and the INH signal. The MODE signal is the SMOD signal if BIST cell 100 is to be used as a bus hold. The MODE signal is coupled to Vdd if BIST cell 100 is to be used as a pullup. The INH signal is the inhibit-out signal of the last of the chain of tri-state drivers.

BIST cell 100 consists of inverter 101 which receives the last inhibit-out signal INH. NAND gate 102 receives the output from inverter 101 along with the MODE signal. The output of NAND gate 102 is tied to the gate of p-channel transistor 103. The source of transistor 103 is tied to Vdd, while the drain is tied to a holding cell. In the currently preferred embodiment, the holding cell consist of two invertors, 104 and 105, coupled to a HOLD output.

If BIST cell 100 is being used as a bushold: when BIST cell 100 is in either reset mode (DMOD=0, SMOD=0) or user mode (DMOD=1, SMOD=0), the output of NAND gate 102 is always a logical 1. If the output of NAND gate 102 is a logical 1, transistor 103 does not conduct. In this situation, the status of the bus remains the same. If the user's circuit is in shift mode (DMOD=0, SMOD=1) or BIST mode (DMOD=1, SMOD=1), the output of NAND gate 102 depends on the inhibit-out signal INH. If inhibit-out signal INH is at logical 1, indicating that one of the drivers is driving the bus, the output of NAND gate 102 is a logical 1 and transistor 103 remains off. However, if inhibit-out signal INH is at logical 0, indicating that none of the drivers are driving the bus, the output of NAND gate 102 is a logical 0 and transistor 103 turns on. In this situation, the HOLD signal is pulled up to Vdd.

Therefore, as a bus hold circuit, BIST cell 100 holds the state of the bus. However, in BIST mode, BIST cell 100 acts as a bus pullup by using the last inhibit-out signal INH to determine when none of the BIST drivers are driving the bus and driving the bus to a logical 1 when it has made such a determination.

If BIST cell 100 is being used as a bus pullup, the MODE signal is coupled to Vdd. In this situation, the output NAND gate 102 depends on the INH input. If the INH input is a logical 1, indicating that one of the drivers is driving the bus, inverter 101 outputs a logical 0. The logical 0 output causes NAND gate 102 to output a logical 1 and transistor 103 remains off. However, if the INH signal is at logical 0, indicating that none of the drivers are driving the bus, inverter 101 outputs a logical 1. The logical 1 output causes NAND gate 102 to output a logical 0 and transistor 103 turns on. When this occurs, the HOLD signal is pulled up to Vdd. It should be noted that when BIST cell 100 acts as a bus pullup, the BIST mode signals, DMOD and SMOD, do not contribute to the operation of BIST cell 100.

Feedback

All logic circuits having feedbacks contain memory elements. Feedback elements exist where the output is the product of its previous value. Since feedback constitutes memory for BIST purposes, feedback must be eliminated during self-test to insure that all states are known. It should be noted that if the feedback occurs through a clocked storage element, it is not considered memory. By eliminating the feedback, the memory element is eliminated. To eliminate the feedback, the present invention inserts a feedback breaker cell in the feedback path. It should be noted that this approach is applicable to all logic devices which employ feedback elements.

An example of a memory element with a feedback line is shown as BIST latch cell 110 in FIG. 10. Latch cell 110 consists of multiplexor (MUX) 111 having inputs A, B and a selection signal S. Input A is coupled to the output of MUX 111 on feedback line 112. Feedback line 112 is coupled through feedback breaker 113. Breaker 113 is transparent in user mode. Therefore, latch cell 110 operates as a latch during user mode. In self-test mode, however, breaker 113 acts as a regular flip-flop. In this manner, breaker 113 allows the state to be captured and, therefore, controlled. Since the state can be determined, it can be tested.

The currently preferred embodiment of feedback breaker is shown as BIST feedback breaker 120 in FIG. 11. Referring to FIG. 11, BIST feedback breaker 120 comprises BIST flip-flop 121, multiplexor (MUX) 124, OR gate 123 and inverter 122. BIST D flip-flop 121 receives the BIST controller mode signals, DMOD and SMOD, a shift-in signal SIN output from the previous BIST cell on the scan chain, the data D on feedback line 112 from output Z (FIG. 10), and a clock signal CLK. The output of BIST D flip-flop 121 is coupled to the D1 input of MUX 124. The D0 input of MUX 124 is coupled to the D data input corresponding to the output Z of MUX 111 on feedback line 112 (FIG. 10). The input S to MUX 124 is coupled to the output of OR gate 123. The output Q of MUX 124 is coupled to input A of MUX 111 (FIG. 10). The inputs of OR gate 123 are coupled to the SMOD signal and the output of inventer 122. The input of inverter 122 is coupled to the DMOD signal.

BIST D flip-flop 121 produces the same output in response to the same input as BIST cell 40 of FIG. 3. In the currently preferred embodiment, BIST D flip-flop 121 comprises the same hardware as BIST cell 40 of FIG. 3. During reset mode (DMOD=0, SMOD=0), flip-flop 121 produces a logical 0 at its Q output, thereby intializing the BIST chain and the sequential logic being tested. In user mode (DMOD= 1, SMOD=0), flip-flop 121 operates normally, such that at the clock pulse the Q output is the value of output Z (FIG.

10) on its D input. In shift mode (DMOD=0, SMOD=1), the Q output is the value of the SIN input signal. Finally, in BIST mode (DMOD=1, SMOD=1), the Q output of D flip-flop 121 is equal to the exclusive-ORing of the SIN input signal with the output Z (FIG. 10) on the D input.

In the currently preferred embodiment, the Q output of D flip-flop 121 is the D1 input to MUX 124, while the D0 input is the data value output from the Z output of MUX 111 or feedback line 112 (FIG. 10). The Q output of MUX 124 is either the value at D0 on D1 depending on the value of select signal S. Inverter 122 and OR gate 123 operate such that select signal S selects D0 as the output Q of MUX 124 only in user mode. In all other modes, the Q output of MUX 124 is the value on the D1 input. Therefore, during user mode, the Q output of MUX 124 is the Z output of MUX 111 on feedback line 112 (FIG. 10). Thus, during user mode, BIST feedback breaker 120 is transparent to feedback 112 (FIG. 10).

Whereas many alterations and modifications of the present invention will no doubt become apparent to a person of ordinary skill in the art after having read the foregoing description, it is to be understood that the particular embodiment shown and described by way of illustration are in no way intended to be considered limiting. Therefore, reference to the details of the preferred embodiments are not intended to limit the scope of the claims which themselves recite only those features regarded as essential to the invention.

A clock driver circuit for a logic circuit employing a self-test mechanism has been described.

I claim:

1. An integrated circuit comprising:

a logic circuit with memory circuits, wherein a portion of memory circuits have clock inputs supplied by signals generated from random gate logic, a built-in self-test (BIST) mechanism coupled to the memory circuits, said BIST mechanism for testing said logic circuit during self-test and allowing said logic circuit to perform its designated logic function during user mode, said BIST mechanism generating mode signals for controlling the mode of operation for said logic circuit; and a clock driver coupled to said memory circuits and providing said memory circuits with clock signals, said clock driver comprising a first logic circuit to provide said memory circuits with a global clock signal during said user mode and a test clock signal during said self-test;

a second logic circuit coupled to said first logic circuit, said second logic circuit providing an inverted clock signal to some of said memory circuits derived from said global clock signal during said user mode and providing the test clock signal to said some of said memory circuit during said self-test; and a third logic circuit coupled to said first logic circuit, said third logic circuit providing clock inputs of said random gate logic with a buffered clocking signal derived from said global clock signal.

2. The clock driver as in claim 1 wherein a fourth logic circuit is coupled to said portion of memory circuits, said fourth logic circuit receiving said global clock signal and said test clock signal and selecting said global clock signal during said user mode and selecting said test clock during said self-test to be provided to clock inputs of said portion of memory circuits.

3. An integrated circuit comprising:

a combinational and sequential logic circuit with memory circuits;

a built-in self-test (BIST) mechanism coupled to the memory circuits, said BIST mechanism for testing said combinational and sequential logic circuit during self-test and allowing said combinational and sequential logic circuit to perform its designated logic function during user mode, said BIST mechanism generating mode signals for controlling the mode of operation for said combinational and sequential logic circuit; and a clock driver coupled to said memory circuits and providing said memory circuits with clock signals, said clock driver comprising a first clock switch to produce said clock signals for said memory circuits in response to a select signal, said first clock switch providing a first portion of said memory circuits with a global clock signal and a second portion of said memory circuits with an inverted global clock signal during said user mode and for providing said first portion of said memory circuits and said second portion of said memory circuits with a test clock signal during said self-test;

a select signal generator coupled to said first clock switch to provide said select signal, such that said first clock switch provides said memory circuits with said test clock signal when said select signal is in a first state and said global clock signal when said select signal is in a second state; and a buffer coupled to receive and provide said global clock signal to random logic supplying clock inputs of a third portion of memory circuits.

4. The clock driver as in claim 3 wherein a second clock switch is coupled between clock inputs of said third portion of memory circuits and said clock driver, said second clock switch selecting said global clock signal during said user mode and said test clock during said self-test to be provided to clock inputs of said random logic clocking said third portion of memory circuits.

5. The clock driver as in claim 4 wherein said second clock switch comprises a BIST clock mulitplexer, said BIST clock mulitplexer selecting said global clock signal during said user mode and said test clock during said self-test in response to said mode signals.

6. The clock driver as in claim 3 wherein said first clock switch comprises a mulitplexer.

7. An integrated circuit comprising:

a combinational and sequential logic circuit with memory circuits;

a built-in self-test (BIST) mechanism coupled to said memory circuits, said BIST mechanism for testing said combinational and sequential logic circuit during self-test and allowing said combinational and sequential logic circuit to perform a designated logic function during user mode, said BIST mechanism generating mode signals for controlling the mode of operation for said combinational and sequential logic circuit; and a clock driver coupled to said memory circuits and providing said memory circuits with clock signals, said clock driver comprising a multiplexer to output clock signals for said memory circuits in response to a select signal, wherein said multiplexer provides a first portion of said memory circuits with a global clock signal during said user mode and provides said first portion of said memory circuits with a test clock signal during said self-test;

a select signal generator coupled to said multiplexer to generate said select signal, such that said multiplexer provides said memory circuits with said test clock signal when said select signal is in a first state and said global clock signal when said select signal is in a second state; and a buffer coupled to receive and provide said global clock signal to clock inputs of random logic clocking a second portion of memory circuits.

8. The clock driver as in claim 7 wherein a first logic circuit is coupled between clock inputs of said second portion of memory circuits and said clock driver, said first logic circuit selecting said global clock signal during said user mode and selecting said test clock during said self-test.

9. The clock driver as in claim 8 wherein said first logic circuit is a BIST clock mulitplexer, said BIST clock mulitplexer selecting said global clock signal during said user mode and said test clock during said self-test in response to said mode signals.

* * * * *